United States Patent [19]

Yoshii

[11] Patent Number: 5,192,988
[45] Date of Patent: Mar. 9, 1993

[54] SEMICONDUCTOR INTEGRATED CIRCUIT DEVICE PRODUCED BY CHARGED-PARTICLE ETCHING

[75] Inventor: Ichiro Yoshii, Tokyo, Japan

[73] Assignee: Kabushiki Kaisha Toshiba, Kawasaki, Japan

[21] Appl. No.: 728,532

[22] Filed: Jul. 11, 1991

[30] Foreign Application Priority Data

Jul. 13, 1990 [JP] Japan .................................. 2-186878

[51] Int. Cl.⁵ ..................... H01L 29/78; H01L 29/10; H01L 29/34; H01L 29/06
[52] U.S. Cl. .................................. 257/774; 357/59; 257/734; 257/213
[58] Field of Search ..................... 357/23.3, 23.9, 54, 357/59

[56] References Cited

U.S. PATENT DOCUMENTS

| 5,027,186 | 6/1991 | Kinugawa | 357/59 |
| 5,057,886 | 10/1991 | Riemenschneider et al. | 357/54 |
| 5,125,007 | 6/1992 | Yamaguchi et al. | 357/23.3 |

Primary Examiner—Gene M. Munson
Attorney, Agent, or Firm—Finnegan, Henderson, Farabow, Garrett and Dunner

[57] ABSTRACT

A semiconductor integrated circuit device formed on the basis of the design rules of 0.5 μm or less contains a MOS transistor. The MOS transistor is formed at the main surface region of the semiconductor substrate. If the effective gate area of the MOS transistor is S2 and the area of a contact hole made in an interlayer insulating film on the gate electrode of the MOS transistor is S1, the relationship expressed as $S1/S2 \leq 1.8$ is established. The contact hole is made by RIE techniques.

8 Claims, 9 Drawing Sheets

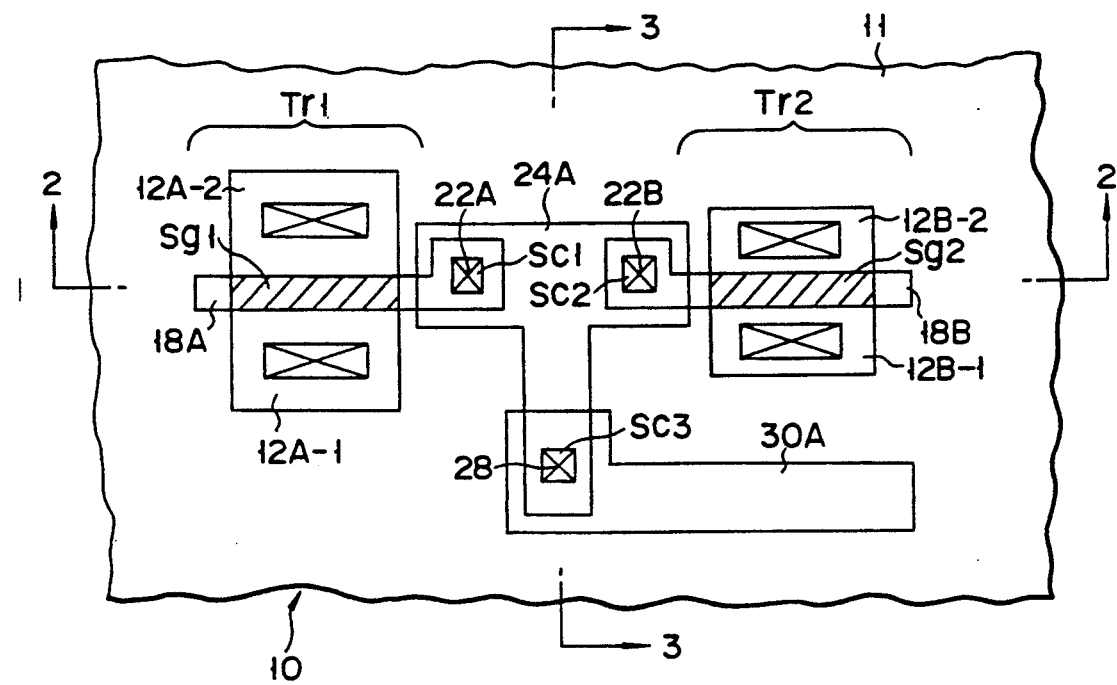
F I G. 1
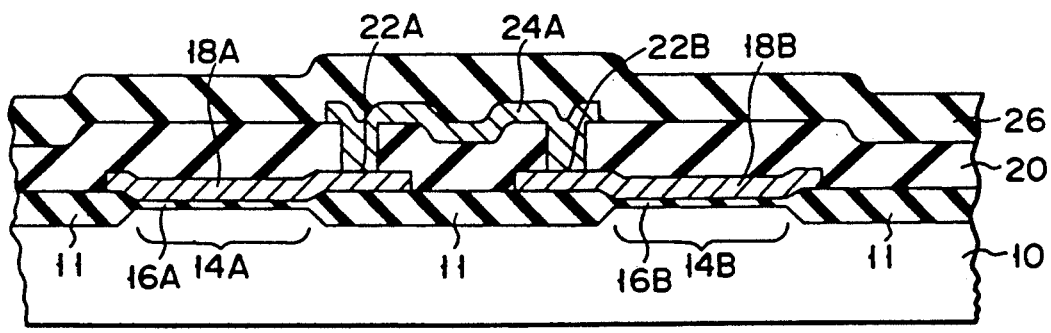
F I G. 2

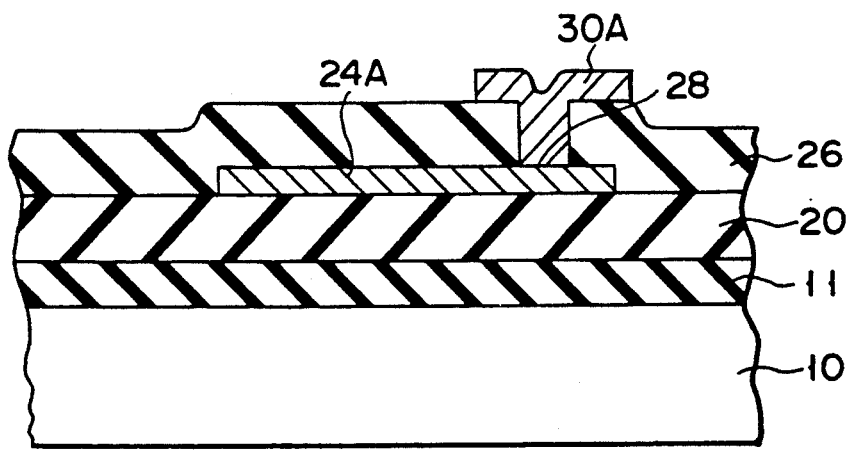
F I G. 3
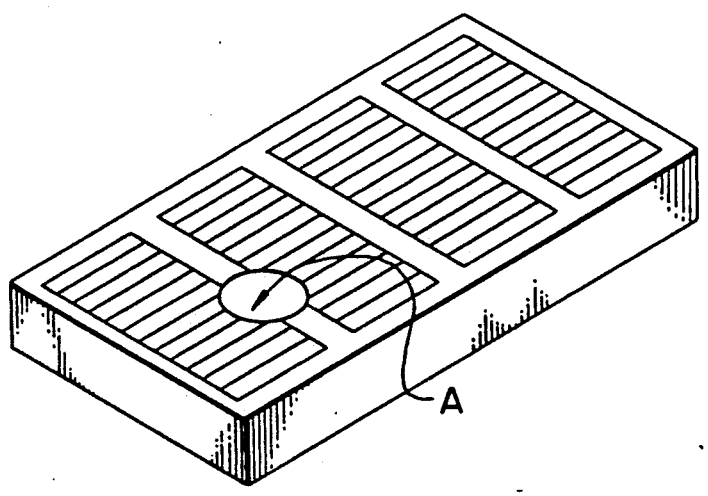
F I G. 4

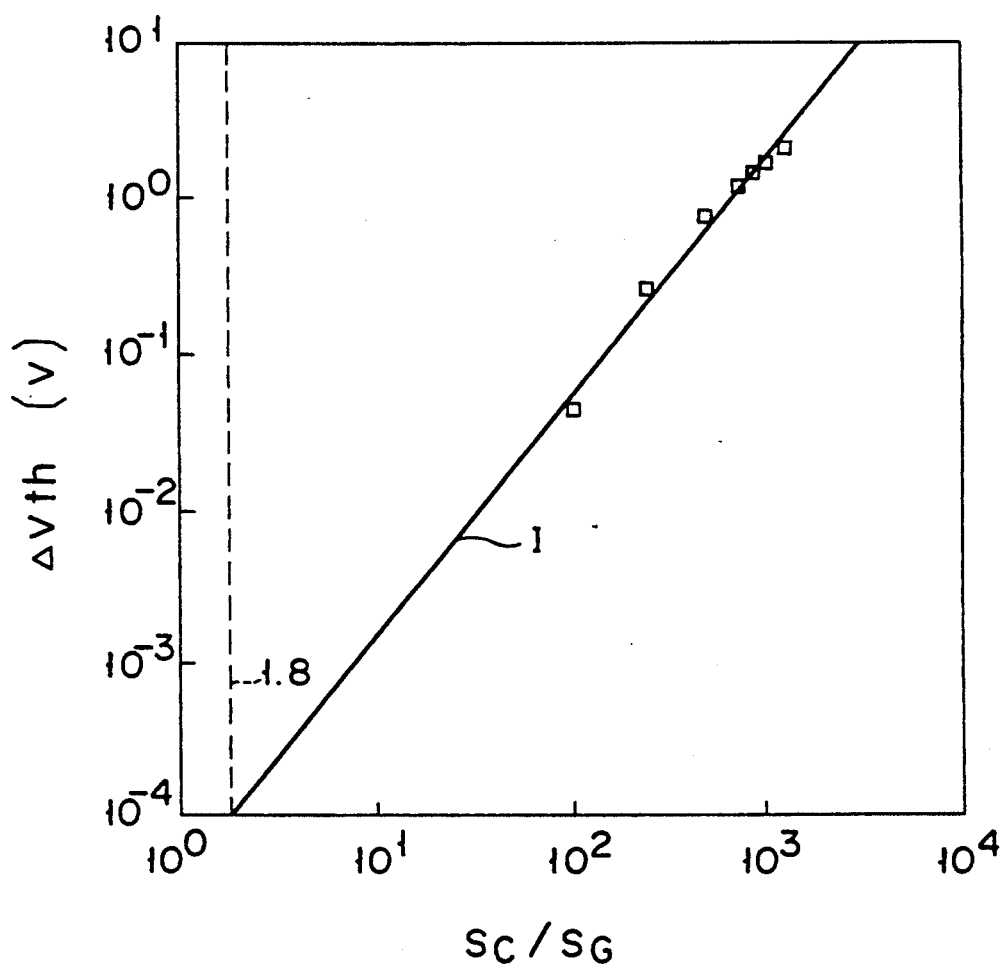
F I G. 5

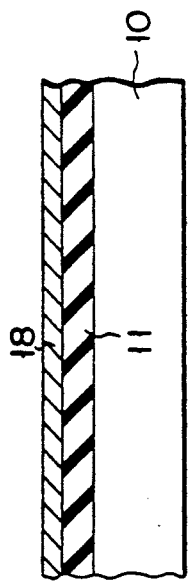
FIG. 7A
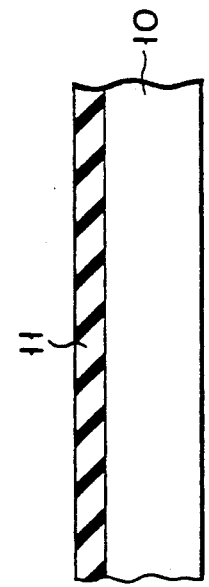
FIG. 7B
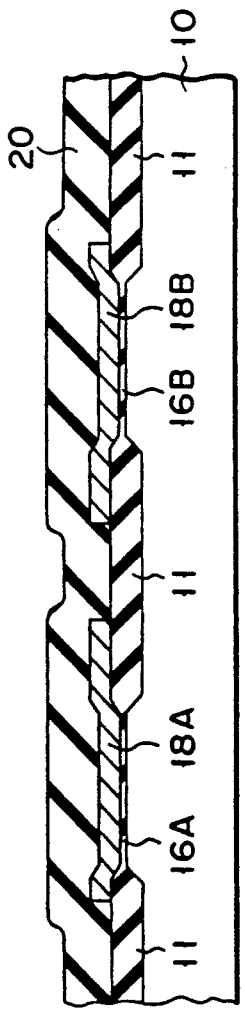
FIG. 7C
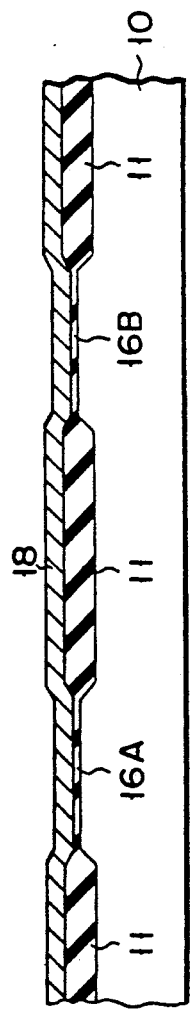
FIG. 6A
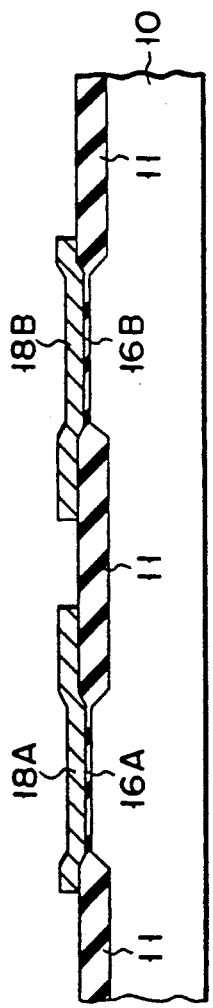
FIG. 6B
FIG. 6C

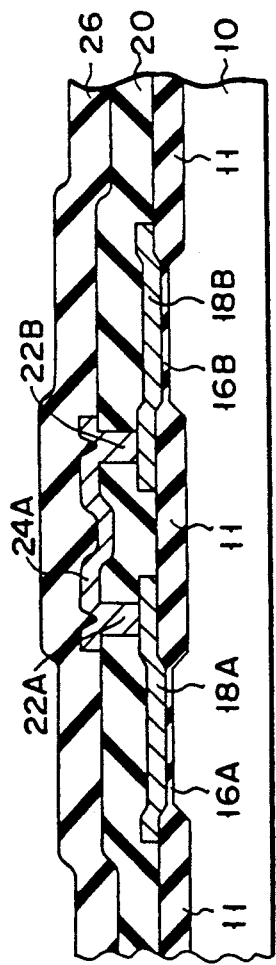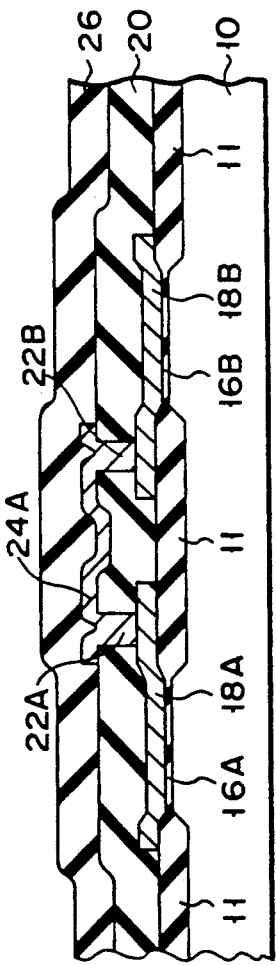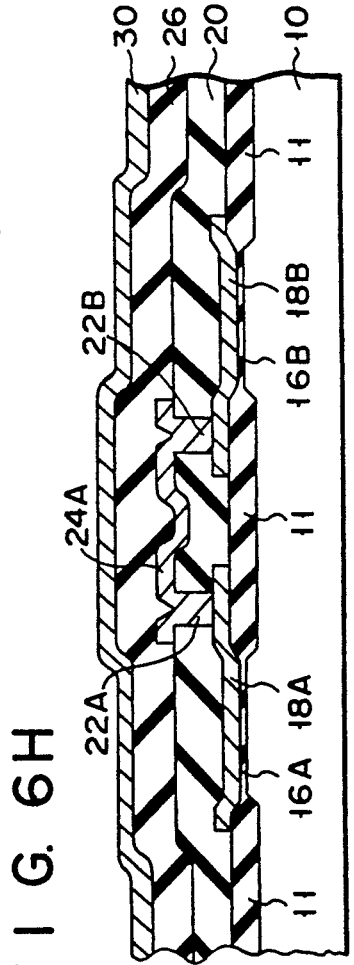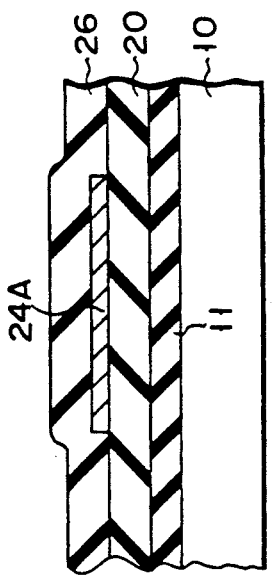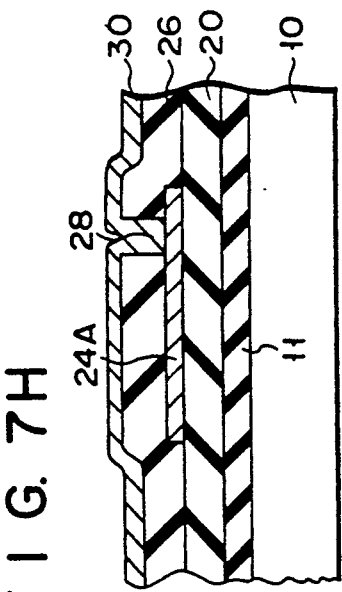
FIG. 6G FIG. 6H FIG. 6I
FIG. 7G FIG. 7H FIG. 7I

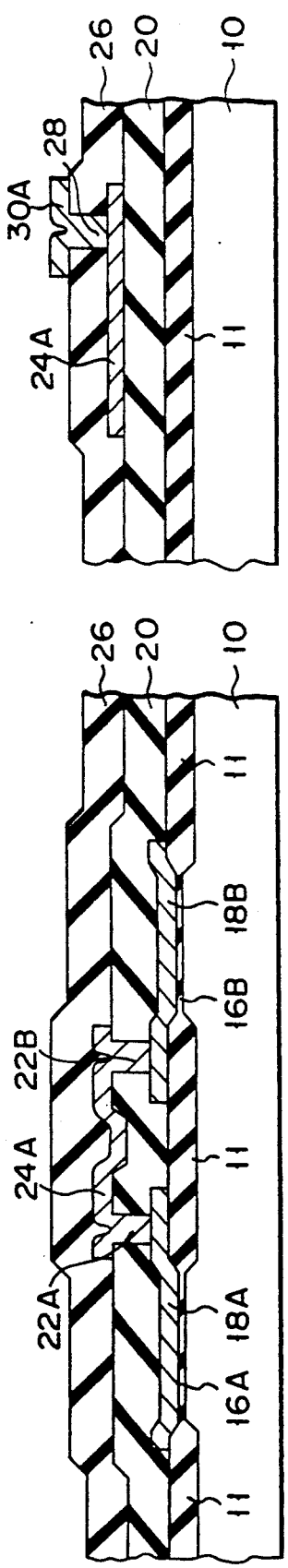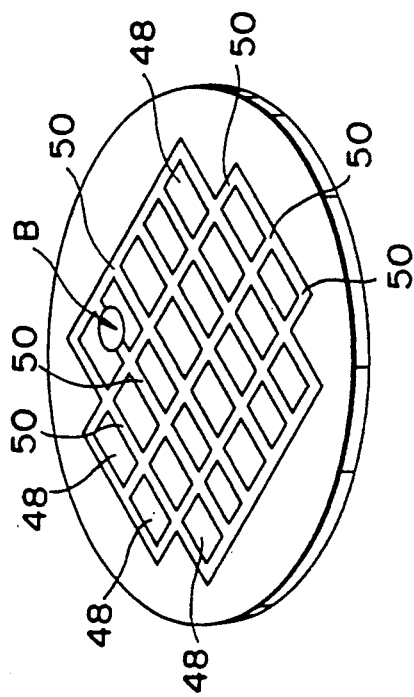

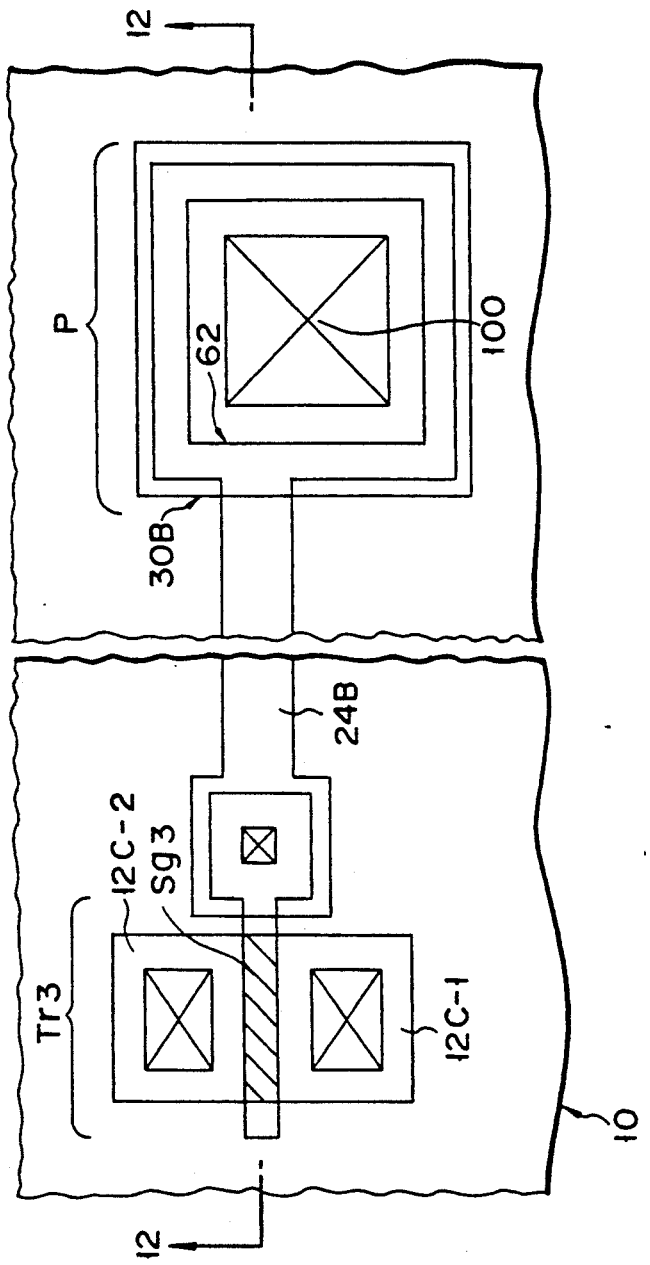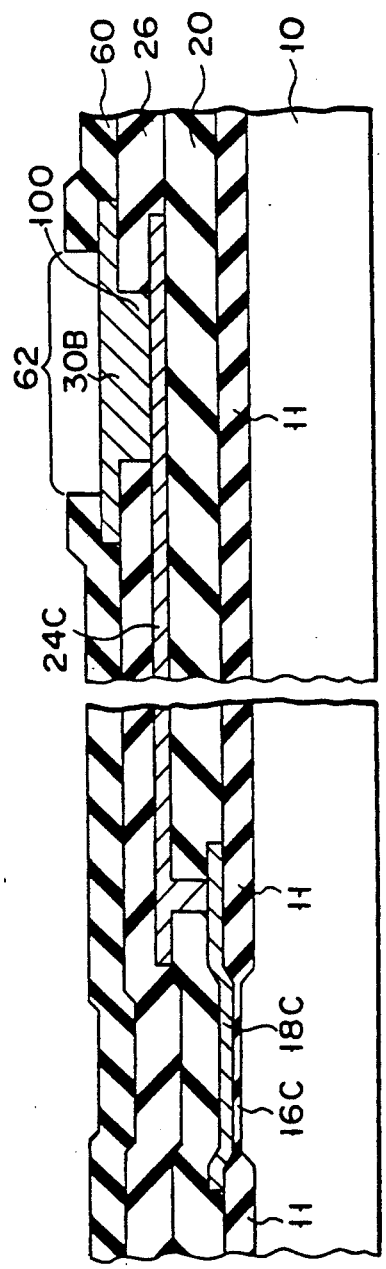
FIG. 11 (PRIOR ART)
FIG. 12 (PRIOR ART)

SEMICONDUCTOR INTEGRATED CIRCUIT DEVICE PRODUCED BY CHARGED-PARTICLE ETCHING

BACKGROUND OF THE INVENTION

1. Field of the Invention

This invention relates to a semiconductor integrated circuit device produced through processes using charged particles such as reactive ion etching, and more particularly to a semiconductor integrated circuit device with an insulated gate.

2. Description of the Related Art

The structure of semiconductor integrated circuit devices with insulated gates is such that conducting layers are put in an electrically floating state during the manufacture. In the case of silicon gate MOS transistors, after the patterning process of polysilicon layer from which gate electrodes are formed is completed, those gate electrodes remain in an electrically floating state until the final wiring process is finished. That is, they are electrically floating throughout the intervening processes, including the source-drain region forming process and the contact-hole forming process (in which holes are made in the insulating film on the gate electrodes and in the insulating film on the wiring layer connected to the gate electrodes). In general, contact holes are made by RIE techniques. In these techniques, however, ions (charged particles) are shed on the film or layer to be etched, so that when etching reaches the gate electrode (the electrically-floating conducting layer), the gate electrode is exposed to the charged particles to be charged with electricity. If the amount of charged electricity is Q and the gate capacity is C, the voltage V applied to the gate insulating film with respect to the charged state of the gate electrode is expressed as:

$$V = Q/C \quad (1)$$

As seen from equation (1), the voltage increases with the amount of charged electricity Q. A larger voltage V applies an excessive electric field on the gate insulting film, giving rise to destruction of or damage to the insulating film, and changes in the characteristics such as fluctuations in the MOS transistor threshold voltage.

More specifically, the destruction of the gate insulating film occurs when the electric field E applied to the gate insulating film exceeds the critical value EB (generally on the order of 10 MV/cm). The amount of charged electricity Q is considered to be proportional to the area of contact hole and thus is given by:

$$Q = Q0 \cdot Sc \quad (2)$$

where Q0 is the total amount of charge of ions applied to a unit area and Sc the area of contact hole.

From equation (1)

$$Q = C \cdot V \quad (3)$$

Equation (3) may be changed as follows:

$$Q = C \cdot V$$

$$Q = C \cdot E \cdot d$$

$$Q = \{\epsilon I \cdot Sg/d\} \cdot E \cdot d$$

$$Q = \epsilon I \cdot Sg \cdot E$$

$$E = Q/(\epsilon I \cdot Sg) \quad (4)$$

where E is the electric field applied to the gate insulating film and d the thickness of gate insulating film (the thickness of dielectric). Substituting equation (2) into equation (4) gives:

$$E = Q0 \cdot Sc/\epsilon I \cdot Sg$$

$$E = \{Q0/\epsilon I\} \cdot \{Sc/Sg\} \quad (5)$$

where $\epsilon I$ is the permittivity of gate insulating film and $Sg$ the area of gate.

Insulated-gate semiconductor integrated circuit devices are now on the way to much higher integration, increasing the relative Sc/Sg ratio. On account of this, the electric field applied to the gate insulating film often exceeds the critical value EB. Especially for semiconductor integrated circuit devices based on the design rules of 0.5 μm or less, as the gate insulating film gets thinner, the film thickness d becomes smaller, so that there is a significant decrease in the breakdown voltage.

SUMMARY OF THE INVENTION

Accordingly, an object of the present invention is to provide a semiconductor integrated circuit device with high reliability in spite of the manufacturing processes using charged particles.

Another object of the present invention is to provide an insulated-gate semiconductor integrated circuit device that achieves a reduction in the amount of charged electricity on the gate electrode in making contact holes by reactive ion etching, thereby causing less destruction of and damage to the gate insulating film and smaller changes in the transistor characteristics.

The foregoing objects are accomplished by a semiconductor integrated circuit device that has been formed on the basis of the design rules of 0.5 μm or less and undergone processes using charged particles, comprising: a first insulating film; a conducting layer formed on the first insulating film; a second insulating film formed on the conducting layer; and an opening made in the second insulating film so as to lead to the conducting layer, with the relationship between the area S1 of the opening and the area S2 of the conducting layer being such as to meet the expression: S1/S2 ≦ 1.8.

With such a semiconductor integrated circuit device, the relationship between the area S1 of the opening and the area S2 of the conducting layer is set so as to meet the expression: S1/S2 ≦ 1.8, the electric field applied to the first conducting film can be reduced even when the opening is made using charged particles.

Therefore, a highly reliable semiconductor integrated circuit device is produced regardless of a process using charged particles. In addition, the contact holes are made by reactive ion etching in such a manner that the amount of charged particles accumulated on the gate electrode can be reduced, which makes it possible to provide an insulated-gate semiconductor integrated circuit device that causes less destruction of and damage to the gate insulating film and smaller changes in the transistor characteristics.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a plan view for a pattern of a silicon gate MOS transistor in a semiconductor integrated circuit device according to a first embodiment of the present invention;

FIG. 2 is a sectional view of the pattern taken along line 2—2 of FIG. 1;

FIG. 3 is a sectional view of the pattern taken along line 3—3 of FIG. 1;

FIG. 4 is a schematic perspective view for a chip incorporating the silicon gate MOS transistors shown in FIGS. 1 through 3;

FIG. 5 is a diagram showing the variation of threshold voltage with the ratio of contact area to gate area;

FIGS. 6A through 6J are sectional views, each corresponding to FIG. 2, illustrating in manufacturing sequence, explaining the manufacturing processes of the semiconductor integrated circuit device shown in FIGS. 1 through 3;

FIGS. 7A through 7J are sectional views, each corresponding to FIG. 3, illustrating in manufacturing sequence, explaining the manufacturing processes of the semiconductor integrated circuit device shown in FIGS. 1 through 3;

FIG. 8 is a schematic perspective view for a wafer containing semiconductor integrated circuit devices according to a second embodiment of the present invention;

FIG. 11 is a plan view for a pattern of a silicon gate MOS transistor in a conventional semiconductor integrated circuit device; and FIG. 12 is a sectional view of the pattern taken along line 12—12 of FIG. 11.

DETAILED DESCRIPTION OF THE PREFERRED EMBODIMENTS

Figure 7D:
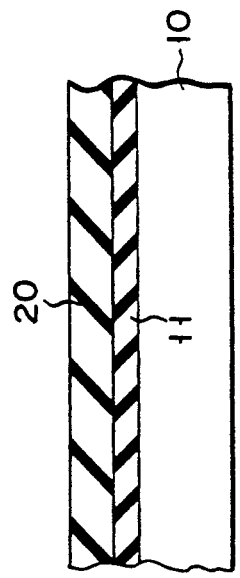

FIGS. 1 through 4 are for explaining a semiconductor integrated circuit device according to a first embodiment of the present invention; FIG. 1 is a plan view for a pattern of a silicon gate MOS transistor; FIG. 2 is a sectional view of the pattern taken along line 2—2 of FIG. 1; FIG. 3 is a sectional view of the pattern taken along line 3—3 of FIG. 1; and FIG. 4 is a schematic perspective view for a chip incorporating the silicon gate MOS transistors shown in FIGS. 1 through 3. The MOS transistors shown in FIGS. 1 through 3 are formed in the region enclosed by circle A in FIG. 4, for example.

As shown in FIGS. 1 through 3, for example, on the surface of a silicon substrate 10, a field oxide film 11 is formed and elements are separated from each other. In the element region, the source and drain regions 12A-1, 12A-2, 12B-1, and 12B-2, whose conductivity is opposite to that of the substrate, are formed. A gate oxide film 16A is formed on the channel region 14A between the source and drain regions 12A-1 and 12A-2, while a gate oxide film 16B is formed on the channel region 14B between the source and drain regions 12B-1 and 12B-2. On the gate oxide films 16A and 16B, gate electrodes 18A and 18B are formed, respectively. Formed on the field oxide film 11, and gate electrodes 18A and 18B is a first-level interlayer insulating film 20, in which contact holes 22A and 22B are made down to the gate electrodes 18A and 18B, respectively. On the interlayer insulating film 20, a metal wiring layer 24A of a first-level aluminium layer is formed, which is connected to the gate electrodes 18A and 18B via the contact holes 22A and 22B. Formed on the interlayer insulating film 20 and metal wiring layer 24A is a second-level interlayer insulating film 26, in which a contact hole 28 is made down to the metal wiring layer 24A. On the interlayer insulating film 26, a metal wiring layer 30A of a second-level aluminium layer is formed, which is connected to the metal wiring layer 24A via the contact hole 28.

In a semiconductor integrated circuit device with the above-mentioned structure, it is assumed that the effective gate area of a first MOS transistor (one hatched region in FIG. 1) is Sg1 and the effective gate area of a second MOS transistor (the other hatched region in FIG. 1) is Sg2.

If the contact area of the contact hole 22A, which is made in the interlayer insulating film 20 on the gate electrode 18A, is Sc1, Sg1 and Sc1 are set so as to meet the following conditions:

$$Sc1/Sg1 \leq 1.8$$

Similarly, if the contact area of the contact hole 22B, which is made in the interlayer insulating film 20 on the gate electrode 18B, is Sc2, Sg2 and Sc2 are set so as to meet the following conditions:

$$Sc2/Sg2 \leq 1.8$$

Further, if the contact area of the contact hole 28, which is made in the interlayer insulating film 26 on the metal wiring layer 24A, is Sc3, Sc1, Sg1 and Sg2 are set so as to meet the following conditions:

$$Sc3/(Sg1+Sg2) \leq 1.8$$

By setting the gate electrode area and the contact hole area as described above, the amount of charged electricity on the gate electrodes 18A and 18B can be reduced, even when contact holes 22A and 22B are made in the interlayer insulating film 20 on the conducting layer that is put in an electrically floating state in the course of manufacturing gate electrodes 18A and 18B by charged-particle etching, such as RIE techniques. The reduced amount of charged electricity causes less destruction of and damage to the gate insulating films 16A and 16B and smaller changes in the threshold voltage for the MOS transistors Tr1 and Tr2.

The above-stated conditions are established on the basis of the variation of threshold voltage $\Delta V_{th}$ with the ratio Sc/Sg of the contact area to the gate area shown in FIG. 5. As seen from FIG. 5, the variation of threshold voltage $\Delta V_{th}$ of MOS transistor increases as the ratio Sc/Sg becomes larger. The straight line I connecting individual measurement points is such that at a ratio Sc/Sg of 1.8, the variation of the threshold voltage $\Delta V_{th}$ drops to as low as $10^{-4}$, extremely close to zero. The variation of threshold voltage $\Delta V_{th}$ of the order of $10^{-4}$ means that changes in the characteristics of MOS transistors Tr1 and Tr2 are negligibly small. Therefore, the electric field applied to the gate insulating films 16A and 16B is also decreased to the practically allowable range, thereby eliminating destruction of and damage to the gate insulating films 16A and 16B and other elements.

As described above, a highly reliable semiconductor integrated circuit device, where the gate oxide films 16A and 16B are hardly destroyed or damaged and the characteristics of transistors Tr1 and Tr2 remain almost unchanged, is obtained, as a result of setting Sc1/Sg1, Sc2/Sg2, and Sc3/(Sg1+Sg2) to 0.2 and making sufficiently small the ratio Sc/Sg of the contact area of contact hole to the gate electrode area.

Maintaining the foregoing ratio throughout the chip shown in FIG. 4 eliminates destruction of and damage to the gate oxide films and variations in the transistor characteristics for all elements in the chip, thereby producing a semiconductor integrated circuit device with higher reliability.

Referring to FIGS. 6A through 6J and 7A through 7J, the manufacturing method for the silicon gate MOS transistor shown in FIGS. 1 through 3 will be explained. FIGS. 6A through 6J illustrate sectional views, each corresponding to FIG. 2, in manufacturing sequence; FIGS. 7A through 7J show sectional views, each corresponding to FIG. 3, in manufacturing sequence. The manufacturing processes to be explained will be carried out following the 0.5 $\mu$m design rules.

As shown in FIGS. 6A and 7A, the field oxide film 11 is first formed on the silicon substrate 10 by selective oxidation. On the surface of the element region, gate oxide films 16A and 16B are formed. On the field oxide film 11 and gate oxide films 16A and 16B, a polysilicon layer 18 is formed by CVD techniques.

Then, a mask is produced on the polysilicon layer 18 by photolithography. The polysilicon layer 18 is selectively etched through the mask by RIE techniques to form gate electrodes 18A and 18B as shown in FIGS. 6B and 7B.

After this, to form source and drain regions 12A-1, 12A-2, 12B-1, and 12B-2, impurity ions are implanted into the main surface region of the substrate 10, using the gate electrodes 18A and 18B as a mask (this process is not shown).

Figure 6D:
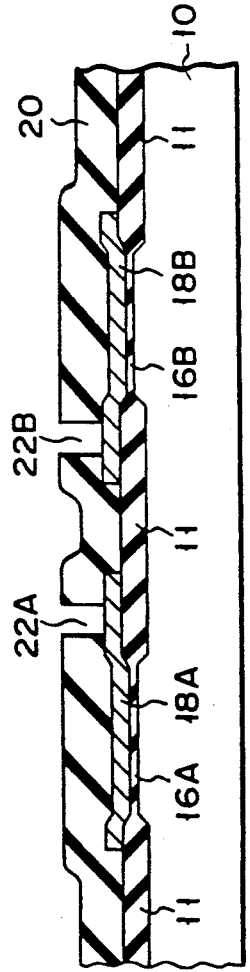

Next, on the resultant structure, the interlayer insulating film 20 is formed by CVD techniques (FIGS. 6C and 7C). On the interlayer insulating film 20, a mask is formed by photolithograpy. With this mask, the interlayer insulating film 20 is selectively etched by RIE techniques to form contact holes 22A and 22B (FIGS. 6D and 7D). In this case, the contact hole 22A is formed under the conditions that the contact area of the gate electrode 18A with the gate oxide film 16A, or the effective gate area Sg1, and the contact area Sc1 of contact hole 22A are set so as to meet the expression Sc1/Sg1 $\leq$ 1.8. Similarly, the contact hole 22B is formed under the conditions that the contact area of the gate electrode 18B with the gate oxide film 16B, or the effective gate area Sg2, and the contact area Sc2 of contact hole 22B are set so as to meet the expression Sc2/Sg2 $\leq$ 1.8.

Figure 7E:
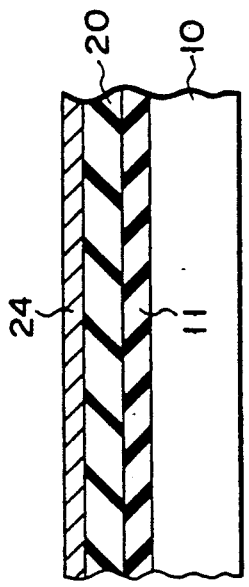
Figure 7F:
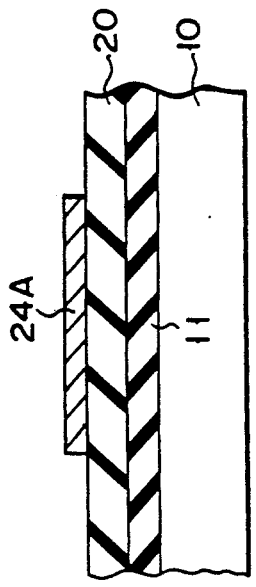
Figure 6E:
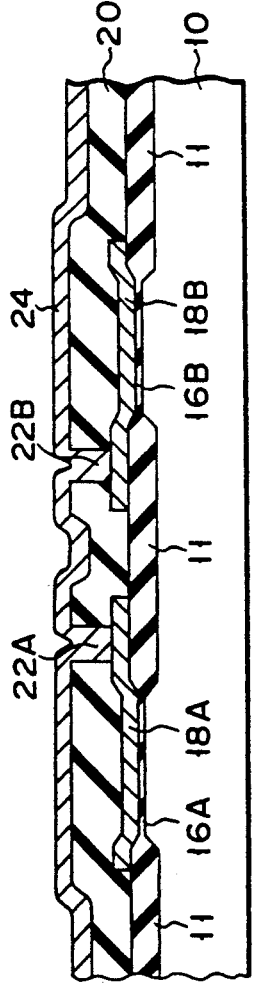
Figure 6F:
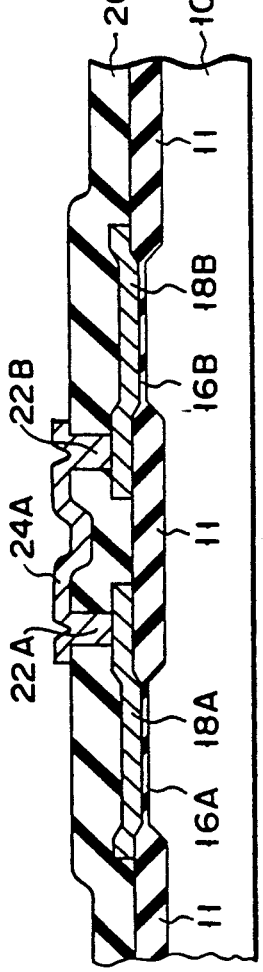

After this, as shown in FIGS. 6E and 7E, on the resultant structure, a first-level aluminium film 24 is formed by sputtering. On the aluminium film 24, a mask is formed by photolithography. With this mask, the aluminium film 24 is selectively etched by RIE techniques to form a metal wiring layer 24A (FIGS. 6F and 7F). On the resultant structure, the interlayer insulating film 26 is formed by CVD techniques (FIGS. 6G and 7G).

Then, as shown in FIGS. 6H and 7H, a mask is formed on the interlayer insulating film 26 by photolithograpy. Using this mask, the interlayer insulating film 26 is selectively etched by RIE techniques to form a contact hole 28.

In this case, the gate areas Sg1 and Sg2, and the contact area Sc3 of the contact hole 28 are set so as to fulfill the expression Sc3/(Sg1+Sg2) $\leq$ 1.8.

The reason why the contact area Sc3 is divided by the sum of the gate areas Sg1 and Sg2 is that the metal wiring layer 24A is electrically connected to both the gate electrodes 18A and 18B.

After this, as shown in FIGS. 6I and 7I, on the resultant structure, a second-level aluminium film 30 is formed by sputtering. On the aluminium film 30, a mask is formed by photolithograpy. With this mask, the aluminium film 30 is selectively etched by RIE techniques to form a metal wiring layer 30A (FIGS. 6J and 7J).

Through the aforementioned processes, a silicon gate MOS transistor is produced according the first embodiment of the present invention.

FIG. 8 is a schematic perspective view for a wafer in which semiconductor integrated circuit devices according to the second embodiment of the present invention. A region 48 is where a chip as shown in FIG. 4 is formed. The wafer is divided into a number of chips 48 by slicing it with, for example, a blade dicer along dicing lines.

Figure 9:
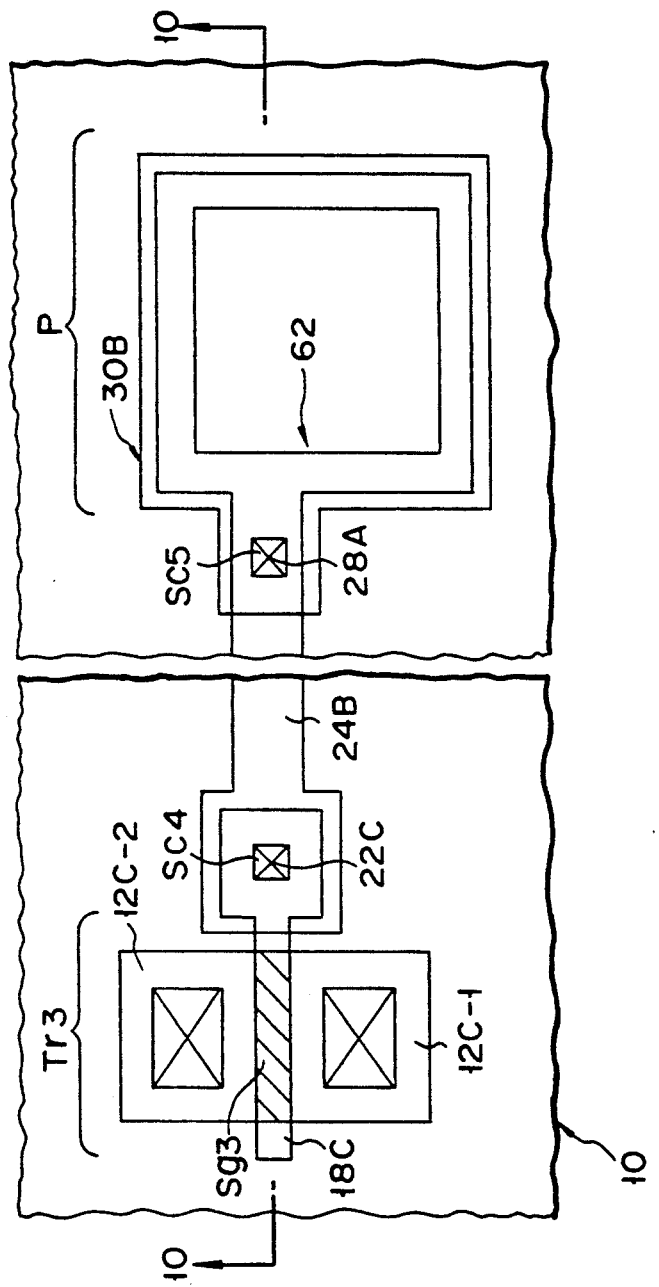
FIG. 9 is a plan view for a pattern of a silicon gate MOS transistor in the semiconductor integrated circuit device formed in the wafer of FIG. 8.
Figure 10:
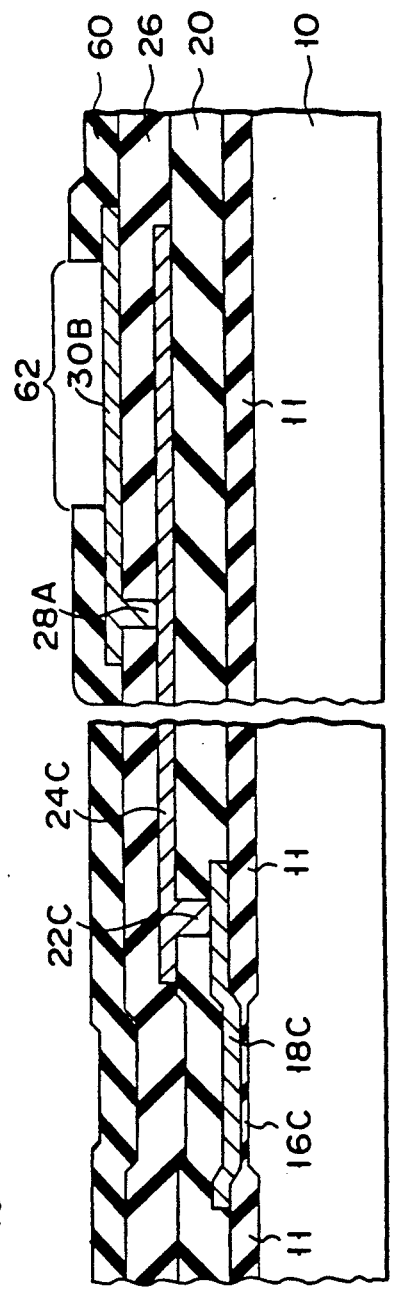
FIG. 10 is a sectional view of the pattern taken along line 10—10 of FIG. 9.

There may be a case where MOS transistors and other elements are formed on dicing lines 50 for integrated circuit chips 48, to monitor the element characteristics. FIG. 9 is a plan view for a pattern of a monitoring MOS transistor and a probing pad (to which the probe is touched to supply a test signal) and FIG. 10 is a sectional view of the pattern taken along line 10—10 of FIG. 9. The MOS transistor Tr3 and probing pad P of FIGS. 9 and 10 are formed in, for example, the region enclosed by circle B of FIG. 8, or on a dicing line 50 (the monitoring MOS transistor Tr3 may be formed within the chip 48). The monitoring MOS transistor Tr3 is electrically connected to the probing pad P via the first-level metal wiring layer 24C, second-level metal wiring layer 30B, and others.

To compare with this invention, a plan view for a pattern of a conventional MOS transistor and a probing pad which are arranged as described above is shown in FIG. 11. A sectional view taken along line 12—12 of FIG. 11 is shown in FIG. 12. As shown in FIGS. 11 and 12, with the conventional arrangement, the area of through-hole 100, which electrically connects the probing pad P with the metal wiring layer 24C, is about ten times as large as the gate area Sg3 of the MOS transistor Tr3. As a result, making a through-hole by RIE techniques results in a large electric field applied to the gate oxide film of the MOS transistor Tr3, causing the destruction of or damage to the gate oxide film 16C and changes in the element characteristics, such as fluctuations in the threshold voltage of the transistor Tr3.

For this reason, in the second embodiment, the relationship between the gate area and the contact area explained in the first embodiment is also applied to the monitoring MOS transistor Tr3. Specifically, if the gate area of MOS transistor Tr3 is Sg3, and the contact area of the contact hole 22C, which is made in the interlayer insulating film 20 on the gate electrode 18C of transistor Tr3, is Sc4, Sg3 and Sc4 are set so as to meet the following conditions:

$$Sc4/Sg3 \leq 1.8$$

As noted above, the destruction of and damage to the gate oxide film 16C and variations in the characteristics of the monitoring MOS transistor Tr3 can be prevented by making sufficiently small the ratio Sc/Sg of the contact area of through-hole to the gate area, or setting the ratio at 1.8 or less for the through-hole 28A formed between the probing pad P and the metal wiring layer 24C.

Establishing the above relations throughout the wafer of FIG. 8 can eliminate destruction of and damage to the gate oxide films of all elements within the wafer and changes in the transistor characteristics.

With the configuration of the second embodiment, since the size of through-hole 28A gets smaller, the formation of through-hole 28A under the probing pad P causes irregularities in the surface of pad P, which makes it difficult for the testing probe to make a good contact. To avoid this problem, the through-hole is made away from the probing pad P, which makes the surface of probing pad P as smooth as possible, thereby assuring a good contact of the testing probe.

As shown in FIG. 10, the semiconductor structure is covered with a protective film 60, in which an opening is made down to the probing pad P. The opening 62 has a rather large area so as to allow the testing probe to come into contact with the probing pad P. Thus, the formation of the opening 62 by charged-particle etching such as RIE techniques affects the gate oxide film 16C of the transistor Tr3. For this reason, it is desirable to form the opening 62 by chemical etching such as CDE techniques.

This invention is not restricted to the above-described semiconductor device composed of three-layered conducting layers consisting of a polysilicon layer, a first-level aluminium film, and a second-level aluminium film, but is applicable to semiconductor devices with a stacked conducting layer consisting of four or more layers. Even with such multilayer structure, a highly reliable semiconductor integrated circuit device, where the gate oxide film of MOS transistor is hardly destroyed or damaged and the transistor characteristics remain almost unchanged, can be obtained by making sufficiently small the ratio Sc/Sg of the contact area Sc of the contact hole in the wiring layer connected to the MOS transistor gate, or of the contact hole in the insulating layer on the wiring layer, with the wiring layer, to the gate area Sg of the MOS transistor, or setting the ratio at 1.8 or less.

As described above, according to this invention, the amount of charged electricity on the gate electrode can be reduced, even when contact holes are made in the insulating films on the conducting layer, which is put in an electrically floating state in the middle of manufacturing gate electrodes, by charged-particle etching such as reactive ion etching. As a result, a highly reliable semiconductor integrated circuit device can be provided which hardly suffers from destruction of and damage to the gate insulating film and has smaller changes in the transistor characteristics.

What is claimed is:

1. A semiconductor integrated circuit device that has been formed on the basis of the design rules of 0.5 μm or less and undergone a process using charged particles, comprising:
   a first insulating film;
   a conducting layer formed on said first insulating film;
   a second insulating film formed on said conducting layer; and
   an opening made in said second insulating film so as to lead to said conducting layer; wherein
   the relationship between the area S1 of said opening and the area S2 of said conducting layer is such as to meet the expression: $S1/S2 \leq 1.8$.

2. A semiconductor integrated circuit device according to claim 1, wherein said first insulating film is formed on a semiconductor substrate and functions as the gate insulating film of a MOS transistor, and said conducting layer functions as the gate electrode of said MOS transistor.

3. A semiconductor integrated circuit device according to claim 1, further comprising a wiring layer formed on said second insulating film and electrically connected to said conducting layer via said opening.

4. A semiconductor integrated circuit device according to claim 1, wherein said first insulating film is an interlayer insulating film formed on the gate electrode of a MOS transistor and said conducting layer is a wiring layer electrically connected to the gate electrode of said MOS transistor.

5. A semiconductor integrated circuit device according to claim 1, wherein said process using charged particles is etching, and said opening is made by said charged-particle etching.

6. A semiconductor integrated circuit device according to claim 5, wherein said etching is based on RIE techniques.

7. A semiconductor integrated circuit device according to claim 1, wherein the relationship between the area S1 of said opening and the area S2 of said conducting layer remains unchanged essentially throughout the semiconductor chip.

8. A semiconductor integrated circuit device according to claim 1, wherein the relationship between the area S1 of said opening and the area S2 of said conducting layer remains unchanged essentially throughout the semiconductor wafer.

* * * * *